(12) United States Patent
Chu et al.

(10) Patent No.: US 7,285,463 B2
(45) Date of Patent: Oct. 23, 2007

(54) METHOD OF FABRICATING NON-VOLATILE MEMORY

(75) Inventors: Chien-Lung Chu, Hsinchu (TW);
Saysamone Pittikoun, Hsinchu County (TW); Houng-Chi Wei, Hsinchu (TW); Wei-Chung Tseng, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 0 days.

(21) Appl. No.: 11/558,453

(22) Filed: Nov. 10, 2006

(65) Prior Publication Data

US 2007/0066008 A1 Mar. 22, 2007

Related U.S. Application Data

(62) Division of application No. 11/161,648, filed on Aug. 11, 2005, now Pat. No. 7,166,512.

(30) Foreign Application Priority Data

Mar. 2, 2005 (TW) .............................. 94106211 A

(51) Int. Cl.
*H01L 21/336* (2006.01)
(52) U.S. Cl. ...................... 438/257; 438/593; 257/316; 257/E21.18; 257/E21.21; 257/E21.423; 257/E21.679

(58) Field of Classification Search ................ 438/257, 438/258, 593; 257/314, 316, E21.18, E21.21, 257/E21.423, E21.679
See application file for complete search history.

(56) References Cited

U.S. PATENT DOCUMENTS 7,238,974 B2 * 7/2007 Strassburg et al. .......... 257/208

* cited by examiner

*Primary Examiner*—Quoc Hoang
(74) *Attorney, Agent, or Firm*—Jianq Chyun IP Office

(57) ABSTRACT

A method of fabricating a non-volatile memory is described. A plurality of first memory units having gaps between each other is formed over a substrate. Insulating spacers are formed on the sidewalls of the first memory units. A composite layer is formed on the substrate and the gaps between the first memory units are filled with a doped polysilicon layer. Thereafter, a portion of the doped polysilicon layer is removed to form trenches. After that, a metallic layer fills the trenches. A portion of the metallic layer is removed to form a plurality of gates. The gates and the composite layer together form a plurality of second memory units. The second memory units and the first memory units together constitute a memory cell column. Then, a source region and a drain region are formed in the substrate adjacent to the two sides of the memory cell column.

8 Claims, 10 Drawing Sheets

METHOD OF FABRICATING NON-VOLATILE MEMORY

CROSS-REFERENCE TO RELATED APPLICATION

This is a divisional application of patent application Ser. No. 11/161,648, filed on Aug. 11, 2005 now U.S. Pat. No. 7,166,512, which claims the priority benefit of Taiwan patent application serial no. 94106211, filed Mar. 2, 2005 and is now allowed. The entirety of each of the above-mentioned patent applications is hereby incorporated by reference herein and made a part of this specification.

BACKGROUND OF THE INVENTION

1. Field of the Invention

The present invention relates to a method of fabricating semiconductor memory device. More particularly, the present invention relates to a method of fabricating non-volatile memory.

2. Description of the Related Art

Among the various types of non-volatile memory products, electrically erasable programmable read only memory (EEPROM) is a memory device that has been widely used inside personal computer systems and electronic equipment. In the EEPROM, data can be stored, read out or erased numerous times and stored data are retained even after power is cut off.

Typically, the floating gate and the control gate of an EEPROM cell are fabricated using doped polysilicon. In the conventional technique, a charge-trapping layer is sometimes used to replace a floating gate fabricated from polysilicon material. The charge-trapping layer is, for example, fabricated using silicon nitride. In general, an oxide layer is formed both above and below the silicon nitride charge-trapping layer to form an oxide-nitride-oxide (ONO) composite structure. This type of memory is often referred to as a silicon-oxide-nitride-oxide-silicon (SONOS) memory device.

The semiconductor manufacturers have produce one kind of non-volatile memory with a structure shown schematically in FIG. 1. The non-volatile memory includes a memory cell column having a plurality of first memory cells 102 and a plurality of second memory cells 116. The first memory cells 102 are separated from the second memory cells 116 through insulating spacers 110 respectively. Each first memory cell 102 includes a bottom dielectric layer 104a, a charge-trapping layer 104b, a top dielectric layer 104c (the bottom dielectric layer 104a, the charge-trapping layer 104b and the top dielectric layer 104c together form a composite layer 104), a gate 106 and a cap layer 108 sequentially stacked on the substrate 100. Each second memory cell 116 similarly includes a bottom dielectric layer 112a, a charge-trapping layer 112b, a top dielectric layer 112c (the bottom dielectric layer 112a, the charge-trapping layer 112b and the top dielectric layer 112c together form a composite layer 112) and a gate 114 sequentially stacked on the substrate 100. Because there is no gap between neighboring memory cells, the level of integration of devices for this type of non-volatile memory is increased.

However, the gates 106 of the first memory cells 102 are fabricated from a polycide material that includes a doped polysilicon layer 106a and a metal silicide layer 106b. On the other hand, the gates 114 of the second memory cells 116 are fabricated from a doped polysilicon material. Since the doped polysilicon material has a resistance much greater than the polycide material, there is a significant difference in the electrical performance between the first memory cells 102 and the second memory cells 116. Hence, there will be a drop in the electrical performance of the devices and a greater instability in the device process.

SUMMARY OF THE INVENTION

Accordingly, at least one objective of the present invention is to provide a method of fabricating a non-volatile memory that can reduce gate resistance, increase memory cell conductivity and increase device performance and stability.

At least a second objective of the present invention is to provide a method of fabricating a non-volatile memory that can in crease device performance. Furthermore, the fabricating method can simplify the manufacturing process and reduce the production cost.

To achieve these and other advantages and in accordance with the purpose of the invention, as embodied and broadly described herein, the invention provides a method of fabricating a non-volatile memory having the following steps. First, a substrate is provided. Then, a plurality of first memory units is formed on the substrate with every two adjoining first memory units are separated from each other by a gap. Each first memory unit includes a first composite layer, a first gate and a cap layer sequentially formed on the substrate. The first composite layer includes a first dielectric layer, a first charge-trapping layer and a top dielectric layer, for example. Thereafter, a plurality of insulating spacers is formed on the sidewalls of the first memory units. After that, a second composite layer is formed over the substrate. The second composite layer includes a second bottom dielectric layer, a second charge-trapping layer and a second top dielectric layer, for example. Then, a doped polysilicon layer is formed over the substrate to fill the gaps between various first memory units. A portion of the doped polysilicon layer is removed so that the surface of the doped polysilicon layer is at least lower than the top surface of the cap layer and a plurality of trenches is formed between the various first memory units. A metallic layer is formed over the substrate to fill the trenches. Afterwards, a portion of the metallic layer is removed until the second composite layer is exposed. The metallic layer and the doped polysilicon layer together form a plurality of second gates, and the second gates and the second composite layer together form a plurality of second memory units. The second memory units and the first memory units together constitute a memory cell column. Thereafter, a source region and a drain region are formed on the two sides of the memory cell column.

According to the aforementioned method of fabricating the non-volatile memory in the preferred embodiment of the present invention, before the step of forming the metallic layer on the substrate to fill the trenches, further includes forming a barrier layer over the substrate. The barrier layer is a titanium/titanium nitride layer formed by sputtering, for example.

According to the aforementioned method of fabricating the non-volatile memory in the preferred embodiment of the present invention, the metallic layer is fabricated using tungsten or metal silicide compound.

According to the aforementioned method of fabricating the non-volatile memory in the preferred embodiment of the present invention, the method of forming a metallic layer to fill the trenches on the substrate includes performing a sputtering process or chemical vapor deposition process.

According to the aforementioned method of fabricating the non-volatile memory in the preferred embodiment of the present invention, the method of removing a portion of the doped polysilicon layer and removing a portion of the metallic layer includes performing an etching back process.

According to the aforementioned method of fabricating the non-volatile memory in the preferred embodiment of the present invention, the first bottom dielectric layer, the first top dielectric layer, the second bottom dielectric layer, the second top dielectric layer can be fabricated by silicon oxide and the first charge-trapping layer and the second charge-trapping layer can be fabricated by silicon nitride or doped polysilicon, for example.

The present invention also provides an alternative method of fabricating a non-volatile memory including the following steps. First, a substrate is provided. Then, a plurality of first memory units is formed on the substrate with every two adjoining first memory units are separated from each other by a gap. Each first memory unit includes a first composite layer, a first gate and a cap layer sequentially formed on the substrate. The first composite layer includes a first bottom dielectric layer, a first charge-trapping layer and a first top dielectric layer, for example. Thereafter, a plurality of insulating spacers is formed on the sidewalls of the first memory units and then a second composite layer is formed over the substrate. The second composite layer includes a second bottom dielectric layer, a second charge-trapping layer and a second top dielectric layer, for example. After that, a doped polysilicon layer is formed over the substrate to fill the gaps between various first memory units. Then, a portion of the doped polysilicon layer is removed so that the top surface of the doped polysilicon layer is at least below the top surface of the cap layer. Thereafter, a metal silicide layer is formed over the doped polysilicon layer. The metal silicide layer and the doped polysilicon layer together form a plurality of second gates and the second gates and the second composite layer together form a plurality of second memory units. The second memory units and the first memory units together constitute a memory cell column. Then, a source region and a drain region are formed in the substrate on the two sides adjacent to the memory cell column.

According to the aforementioned method of fabricating the non-volatile memory in the preferred embodiment of the present invention, the method of removing a portion of the doped polysilicon layer includes performing an etching back process.

According to the aforementioned method of fabricating the non-volatile memory in the preferred embodiment of the present invention, the method of forming the metal silicide layer over the doped polysilicon layer includes depositing metallic material to form a metallic layer over the substrate. Then, an annealing process is performed so that a portion of the metallic layer and the doped polysilicon layer react to form a metal silicide layer. Thereafter, the metallic layer not participated in the reaction is removed. The metallic layer is fabricated using a refractory metal such as cobalt or titaniun and formed by sputtering, for example.

According to the aforementioned method of fabricating the non-volatile memory in the preferred embodiment of the present invention, the first bottom dielectric layer, the first top dielectric layer, the second bottom dielectric layer and the second top dielectric layer can be fabricated by silicon oxide and the first charge-trapping layer and the second charge-trapping layer can be fabricated by silicon nitride or doped polysilicon, for example.

In the method of fabricating the non-volatile memory according to the present invention, only one photomask is required to define the first memory units and the second memory cells is fabricated without using the conventional photolithographic and etching processes. Therefore, the processing is simplified and the production cost is reduced. Furthermore, using polycide compound to form the gate of the second memory units significantly reduces the gate resistance of the second memory units so that the second memory units can have greater conductivity. The first memory units and the second memory units are electrically comparable. Consequently, the performance and stability of the devices are improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 2H through 2I are schematic cross-sectional views showing the steps for fabricating a non-volatile memory according to another preferred embodiment of the present invention.

DESCRIPTION OF THE PREFERRED EMBODIMENTS

Figure 1:
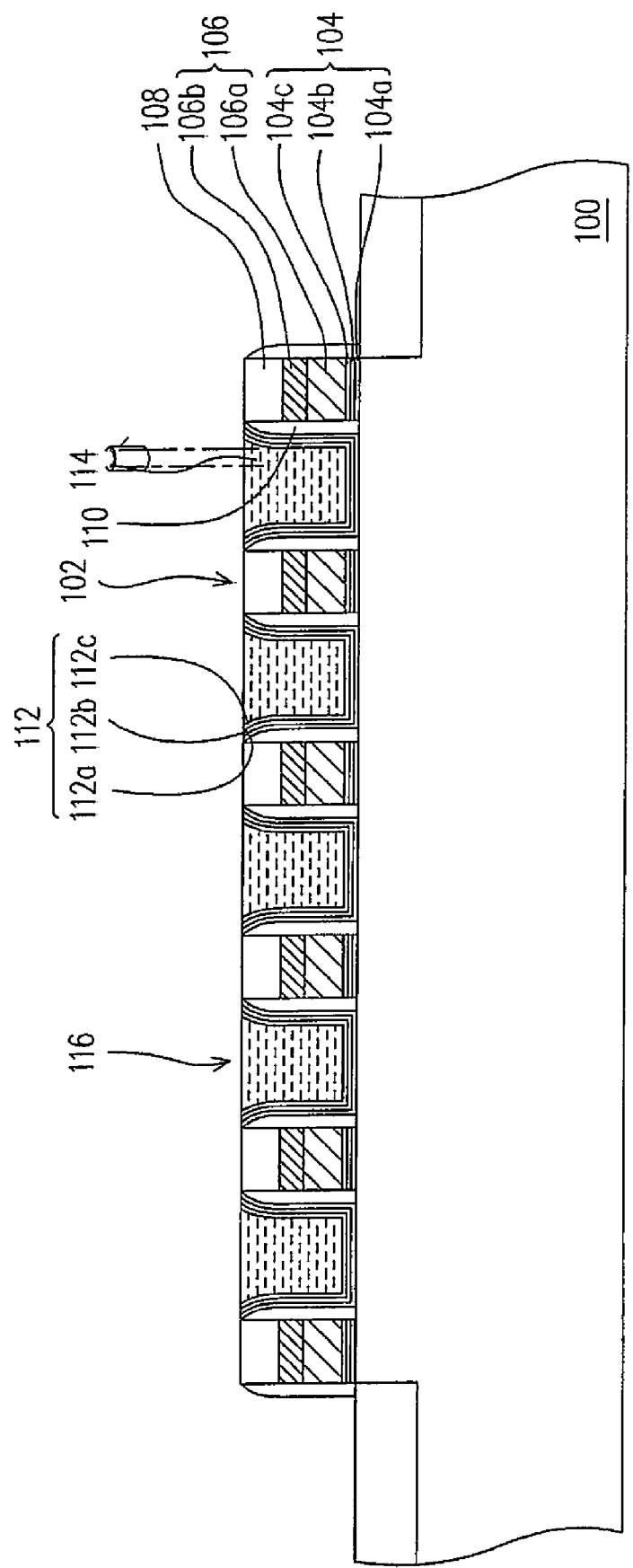
FIG. 1 is a schematic cross-sectional view showing the structure of a conventional non-volatile memory.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
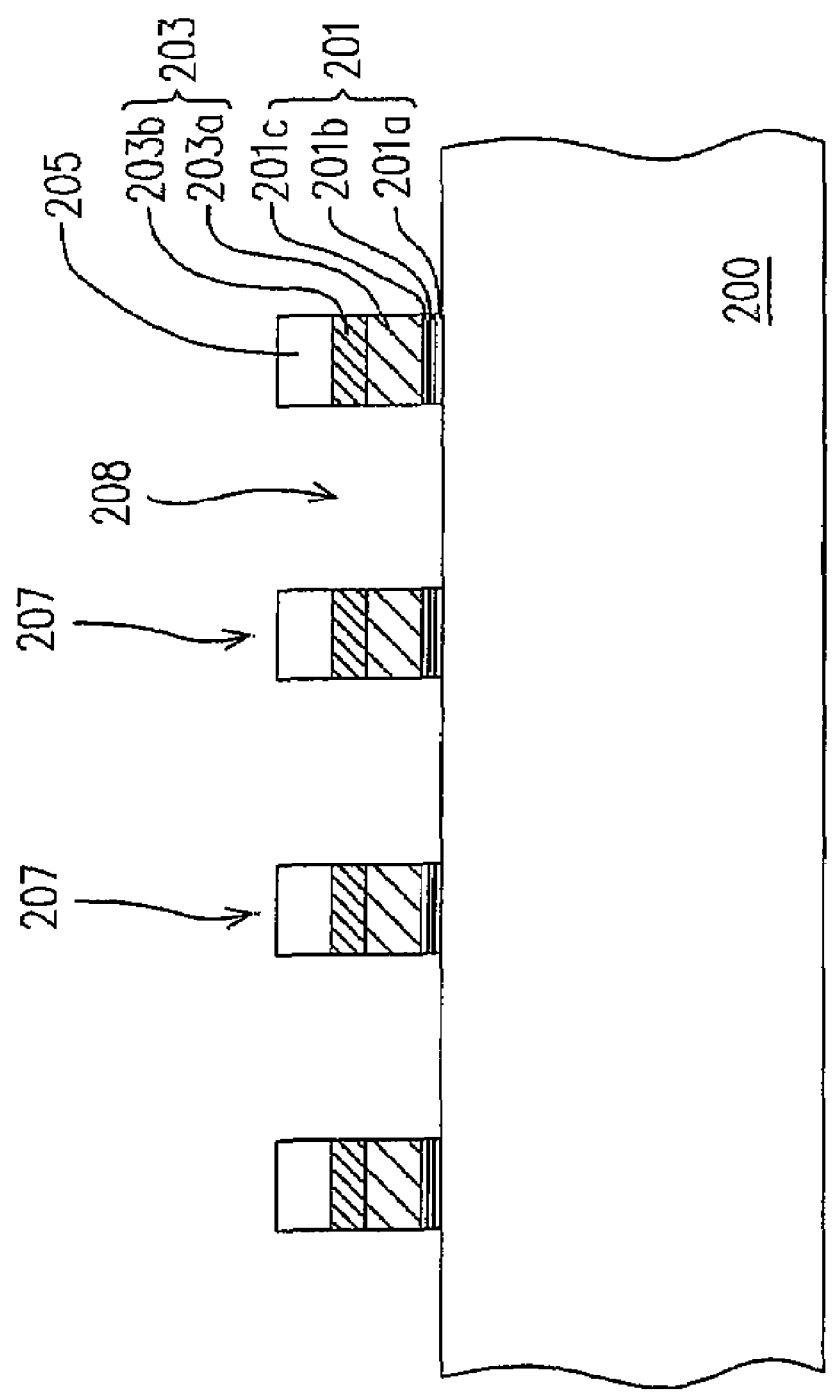
FIGS. 2A through 2G are schematic cross-sectional views showing the steps for fabricating a non-volatile memory according to one preferred embodiment of the present invention.

FIGS. 2A through 2G ate schematic cross-sectional views showing the steps for fabricating a non-volatile memory according to one preferred embodiment of the present invention. As shown in FIG. 2A, a substrate 200 is provided. Then, a plurality of memory units 207 is formed on the substrate 200 with every two adjoining first memory units 207 are separated from each other by a gap 208. Each memory unit 207 includes a composite layer 201, a gate 203 and a cap layer 205, for example. The method of forming the memory units 207 includes forming a composite dielectric material layer, a gate material layer and an insulating material layer sequentially over the substrate 100 and patterning the aforementioned material layers by performing photolithographic and etching processes.

The composite layer 201 includes a bottom dielectric layer 201a, a charge-trapping layer 201b and a top dielectric layer 201c, for example. The bottom dielectric layer 201a is a silicon oxide layer formed, for example, by performing a thermal oxidation process. The charge-trapping layer 201b is a silicon nitride layer formed, for example, by performing a chemical vapor deposition process. The top dielectric layer 201c is a silicon oxide layer formed, for example, by performing a chemical vapor deposition process. Obviously, the bottom dielectric layer 201a and the top dielectric layer 201c can be fabricated from other types of similar materials. Similarly, the material constituting the charge-trapping layer 201b is not limited to silicon nitride. Other types of material that can trap electric charges, for example, tantalum oxide, titanium-strontium acid, hafnium oxide or doped polysilicon can be used as well.

The gates 203 can be fabricated by polycide material, for example. The method of forming the polycide layer includes forming a doped polysilicon layer 203a over the substrate 200 and then forming a metal silicide layer 203b over the doped polysilicon layer 203a. The metal silicide layer 203b is formed, for example, by performing a chemical vapor deposition process or a self-aligned silicide process. The cap layer 205 is a silicon oxide layer formed, for example, by performing a chemical vapor deposition process.

Figure 2B:
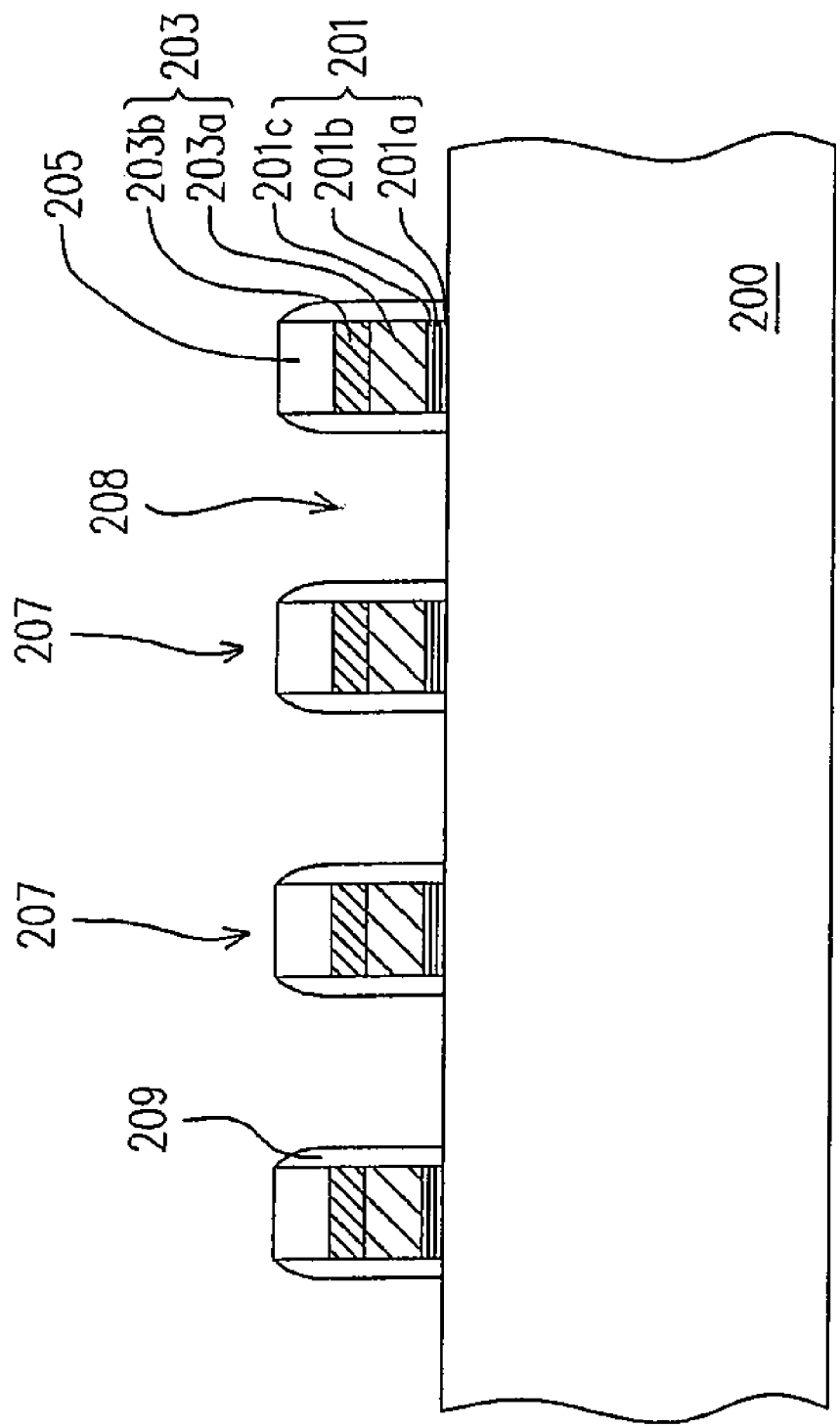

As shown in FIG. 2B, a plurality of insulating spacers 209 is formed on the sidewalls of the memory units 207. The insulating spacers 208 are fabricated by silicon nitride or silicon oxide, for example. The insulating spacers 208 are formed, for example, by depositing insulating material over the substrate 200 to form an insulating material layer and then performing an anisotropic etching process so that only a portion of the insulation material layer remains on the sidewalls of the memory units 207.

Figure 2C:
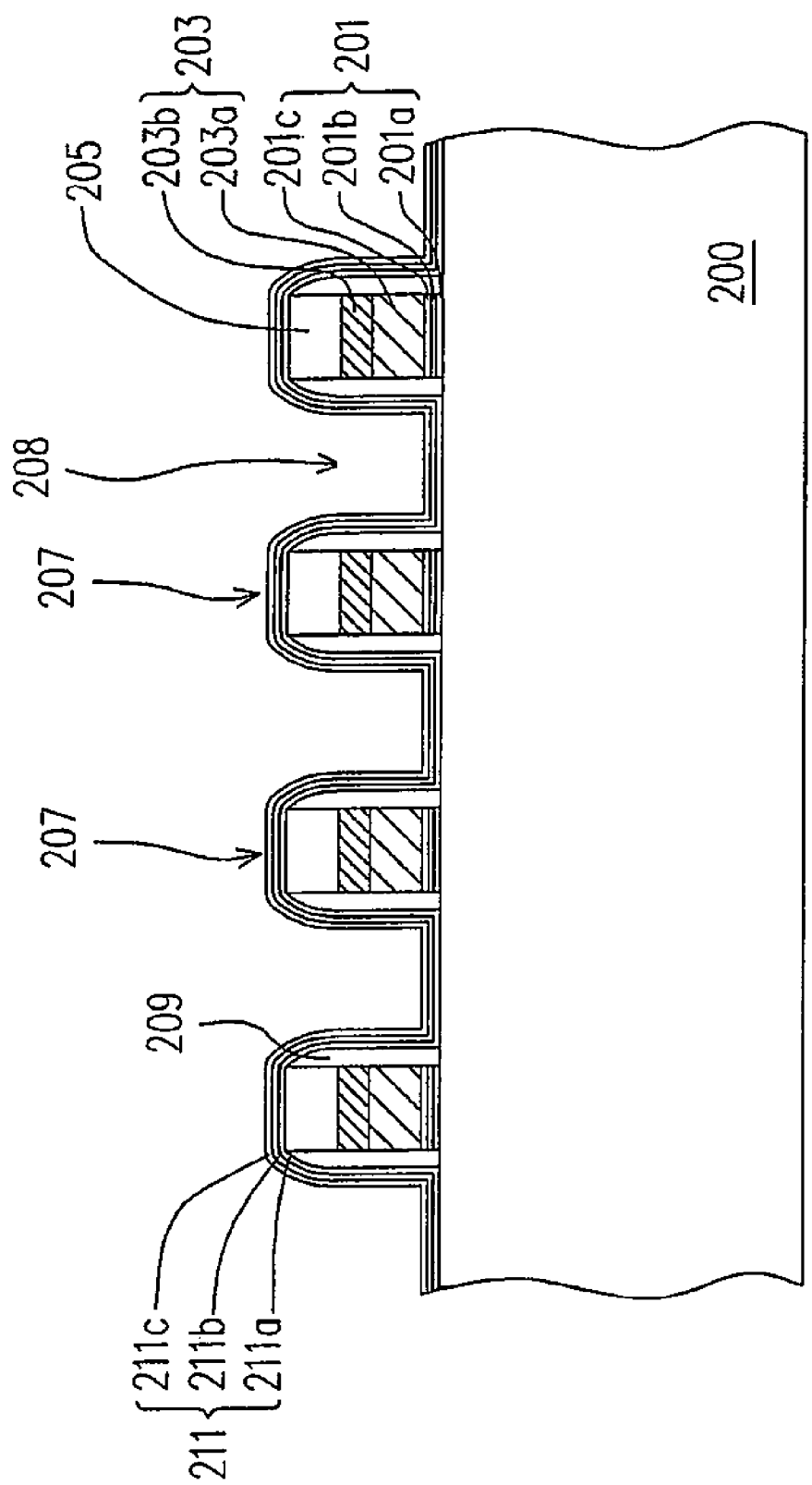

As shown in FIG. 2C, a composite layer 211 is formed over the substrate 200. The composite layer includes a bottom dielectric layer 211a, a charge-trapping layer 211b and a top dielectric layer 211c, for example. The bottom dielectric layer 211a is a silicon oxide layer formed, for example, by performing a thermal oxidation process. The charge-trapping layer 211b is a silicon nitride layer formed, for example, by performing a chemical vapor deposition process. The top dielectric layer 211c is a silicon oxide layer formed, for example, by performing a chemical vapor deposition process. Obviously, the bottom dielectric layer 211a and the top dielectric layer 211c can be fabricated from other types of similar materials. Similarly, the material constituting the charge-trapping layer 211b is not limited to silicon nitride. Other types of material that can trap charges, for example, tantalum oxide, titanium-strontium acid, hafnium oxide or doped polysilicon can be used as well.

Figure 2D:
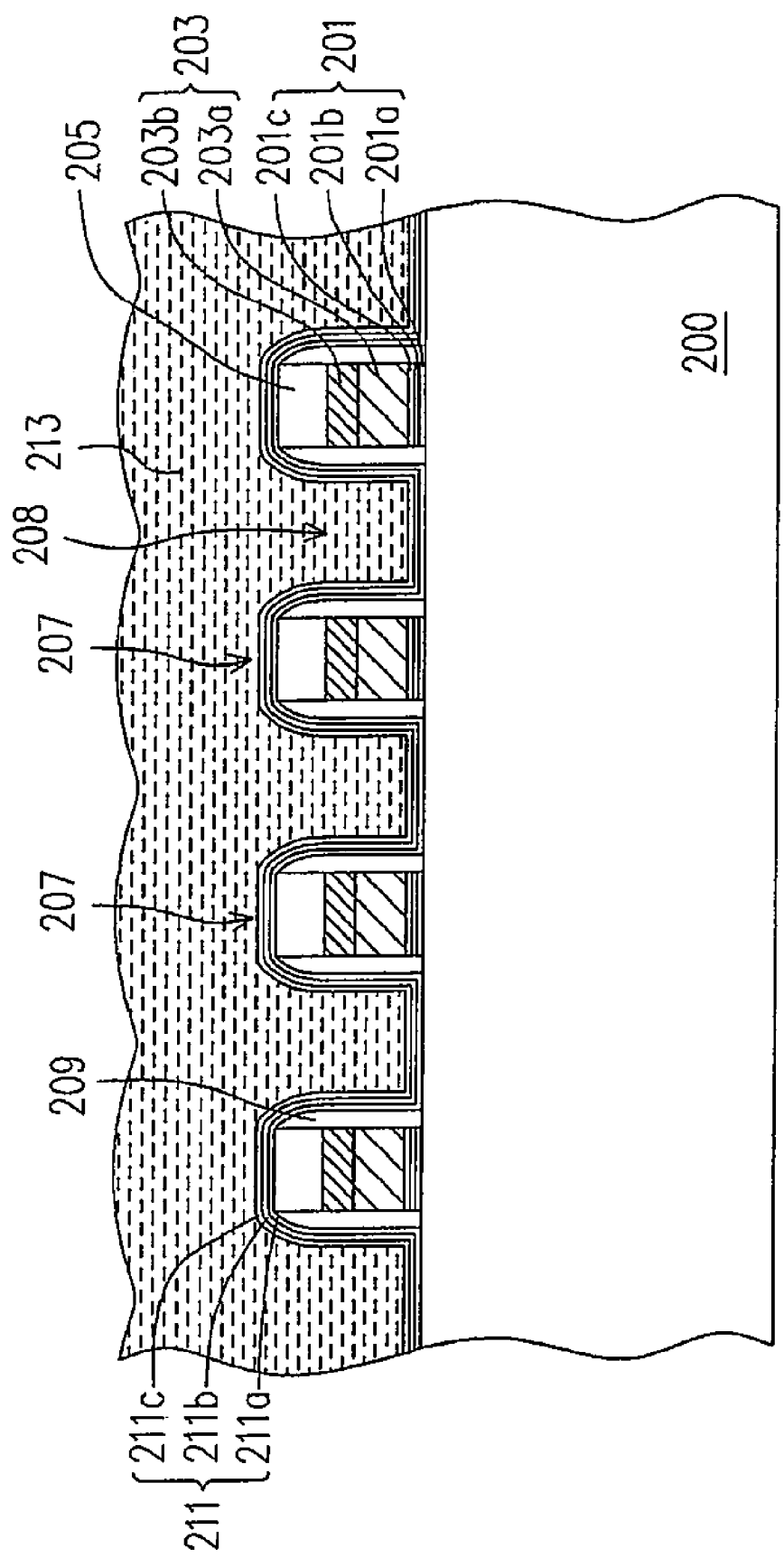

As shown in FIG. 2D, a doped polysilicon layer 213 is formed over the substrate 200 to fill the gaps 208 between various memory units 207. The doped polysilicon layer 213 is formed, for example, by depositing an undoped polysilicon layer in a chemical vapor deposition and performing an ion implanting process thereafter.

Figure 2E:
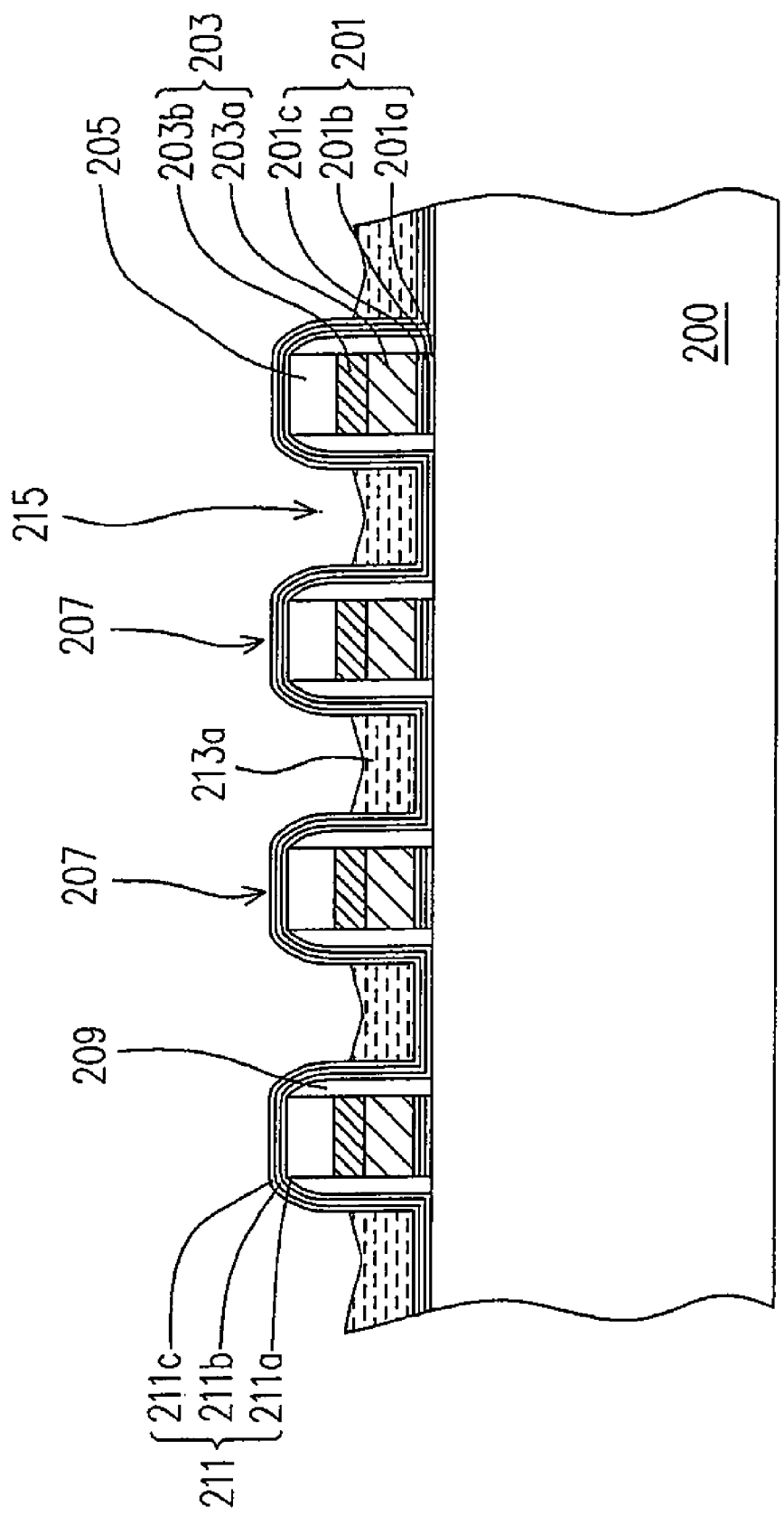

As shown in FIG. 2E, a portion of the doped polysilicon layer 213 is removed to form a plurality of trenches 215 between the memory units 207. The top surface of the doped polysilicon layer 213a is at least lower than the top surface of the cap layer 205. The method of removing a portion of the doped polysilicon layer 213 includes performing an etching back process, for example. The depth of the trenches 215 can be controlled through adjusting the time of the etching back process.

Figure 2F:
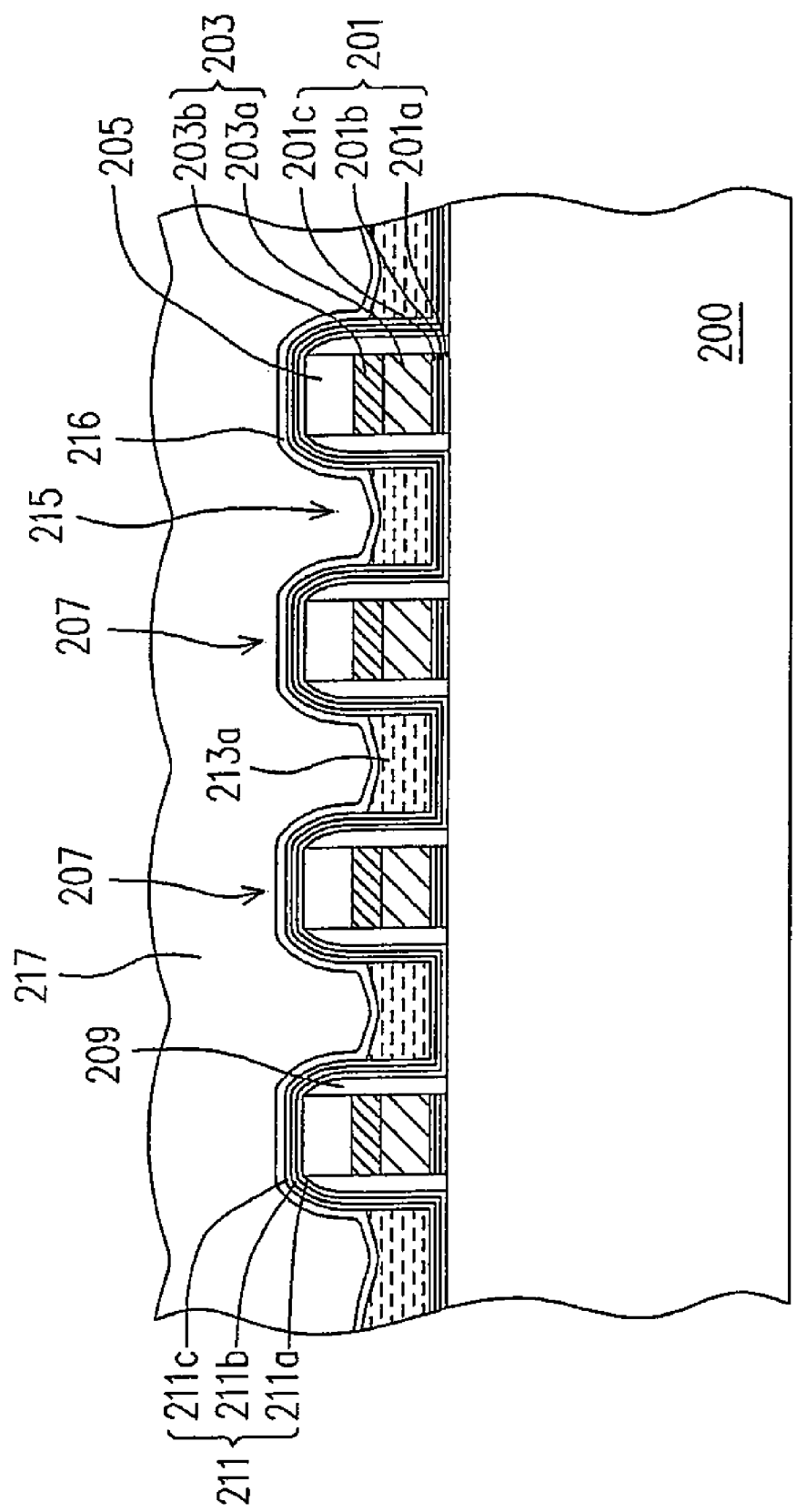

As shown in FIG. 2F, a metallic layer 217 is formed over the substrate 200 to fill the trenches 215. The metallic layer 217 is a tungsten layer formed by sputtering, for example. However, the metallic layer 217 can be fabricated by metal silicide such as tungsten metal silicide in a chemical vapor deposition process. Furthermore, a material may be deposited over the substrate 200 to form an additional barrier layer 216 before forming the metallic layer 217 over the substrate 200 to fill the trenches 215. The barrier layer 216 can be a titanium/titanium nitride layer formed by sputtering, for example.

Figure 2G:
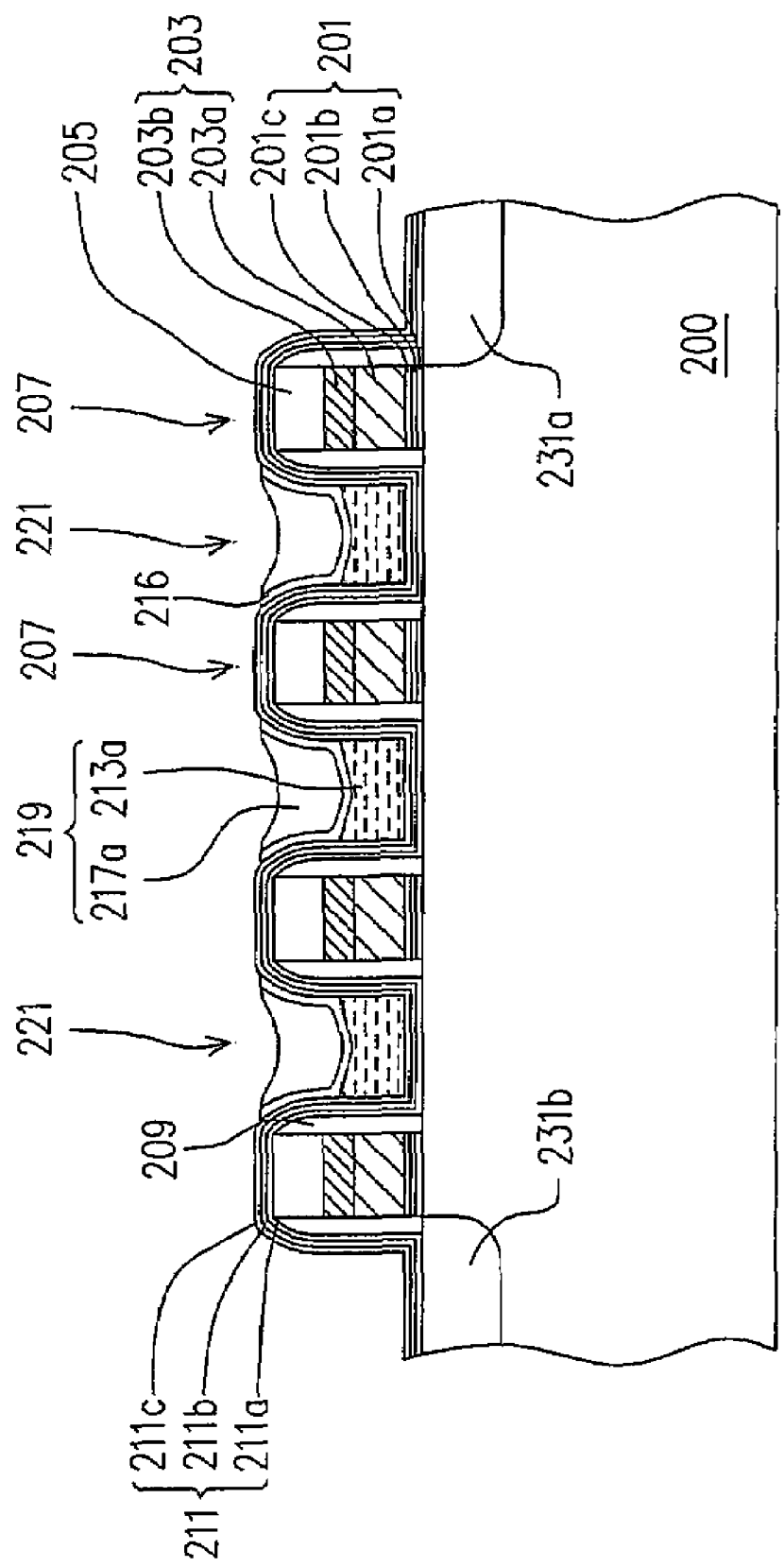

As shown in FIG. 2G, a portion of the metallic layer 217 is removed until the composite layer 211 is exposed. The method of removing a portion of the metallic layer 217 includes performing an etching back process, a chemical-mechanical polishing or some other suitable process. If the embodiment of the present invention includes forming a barrier layer 216, a portion of the barrier layer 216 is removed while removing a portion of the metallic layer 217 to expose the composite layer 211. The metallic layer 217a together with the doped polysilicon layer 213a form a gate 219, and the gate 219 together with the composite layer 211 form a memory unit 221. The memory units 211 and the memory units 207 together constitute a memory cell column. Thereafter, any residual gate material 219 in the area designated for forming the source region and the drain region on each side of the memory cell column is removed. The method of removing residual gate material 219 includes performing an etching process, for example. After that, a source region 231a and a drain region 231b are formed in the substrate on the two sides adjacent to the memory cell column. The step of forming the source region 231a and the drain region 231b includes implanting p-type ions or n-type ions, according to the actual desired device state, into the substrate in an ion implant process, for example.

In the aforementioned embodiment, the gate 219 includes the metallic layer 217a and the doped polysilicon layer 213a. Since the metallic layer 217a can be a tungsten layer or a metal silicide layer, the electrical resistance of the gate 219 is significantly reduced. Furthermore, by forming a barrier layer over the doped polysilicon layer 213a, the ohmic contact with the doped polysilicon layer 213a is improved. In addition, the adhesive strength between the metallic layer 217a and the doped polysilicon layer 213a is reinforced to bring down the gate resistance so that the gate 219 can have a higher electrical conductivity. Thus, the electrical property of the gates 219 and the gates 203 is more compatible with each other and the performance of the devices is improved.

Figure 2H:
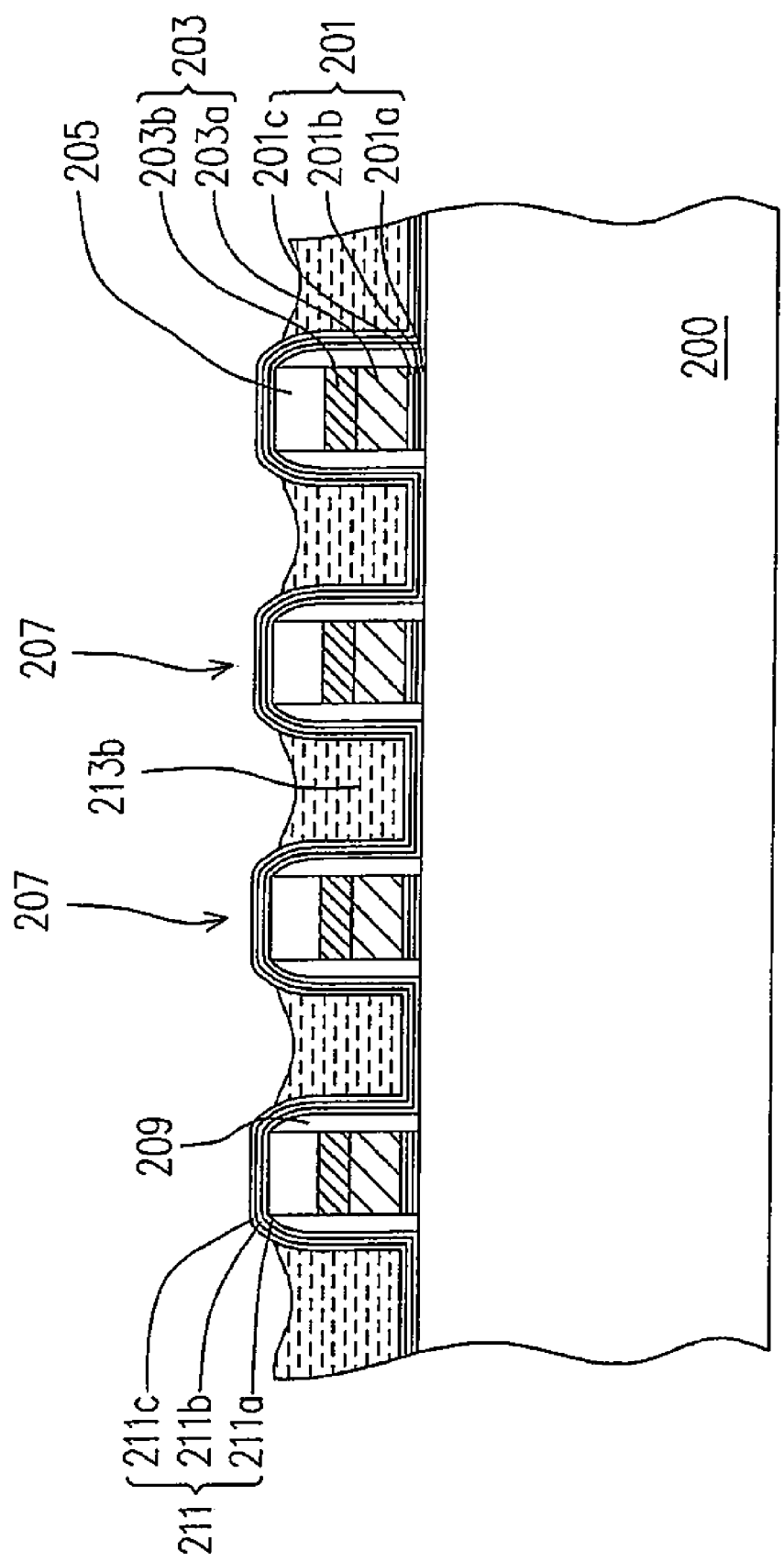
Figure 21:
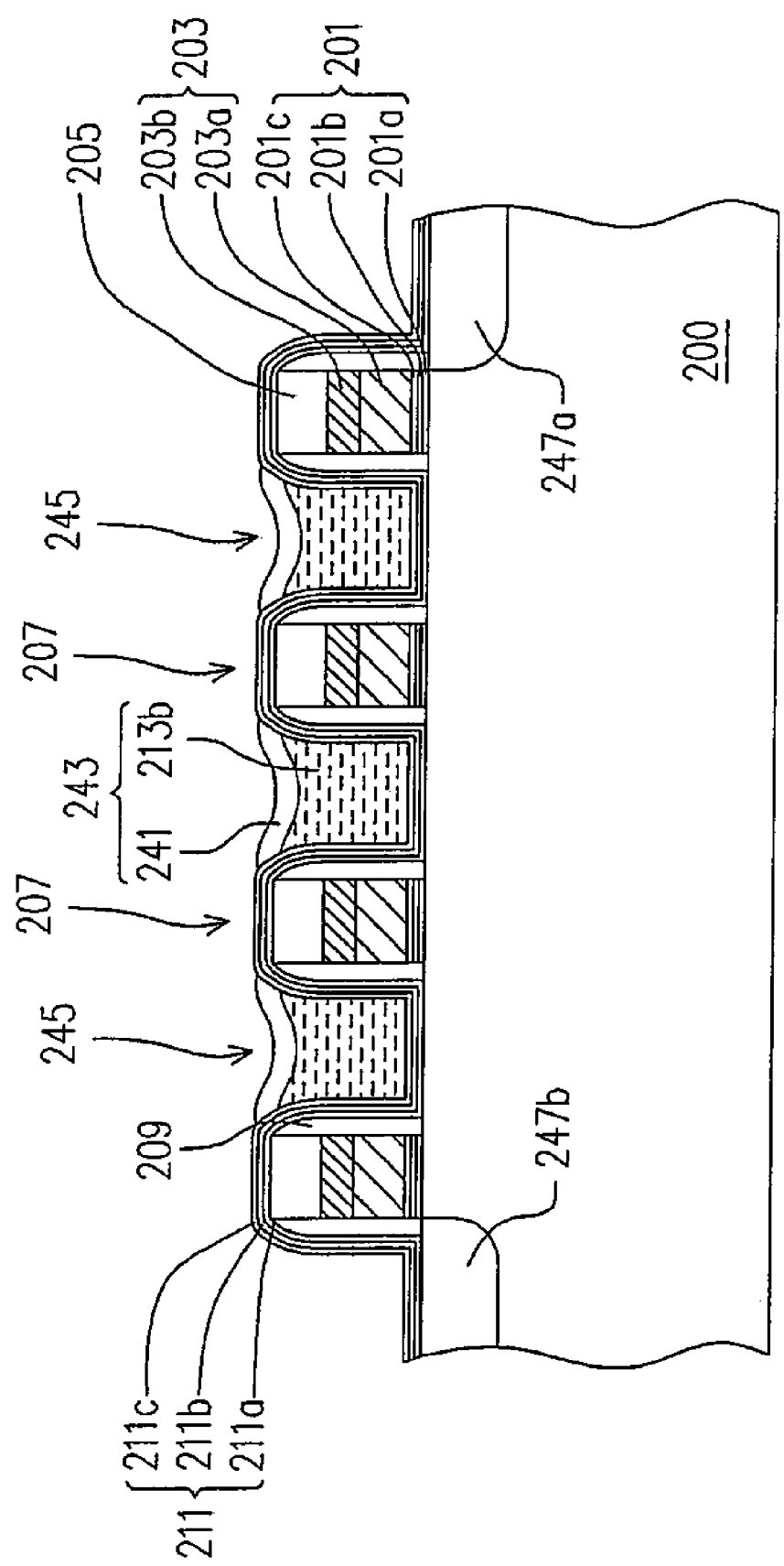

FIGS. 2H through 2I are schematic cross-sectional views showing the steps for fabricating a non-volatile memory according to another preferred embodiment of the present invention. FIG. 2H is a continuation from FIG. 2D. A portion of the doped polysilicon layer 213 is removed so that the top surface of the doped polysilicon layer 213b is at least lower than the top surface of the cap layer 205. The step of removing a portion of the doped polysilicon layer 213 includes performing an etching back process.

As shown in FIG. 2I, a metal silicide layer 241 is formed over the doped polysilicon layer 213b. The method of forming the metal silicide layer 241 includes performing a self-aligned metal silicide process including the following steps. First, a metallic layer (not shown) made from a refractory metal such as cobalt or titanium is formed over the substrate 200, for example, by sputtering. Thereafter, a thermal process is performed so that a portion of the metallic layer reacts with the doped polysilicon layer 213b to form the metal silicide layer 241. After that, the metallic material in the metallic layer not participated in the reaction is removed.

The metal silicide layers 241 together with the doped polysilicon layers 213b form a plurality of gates 243, and the gates 243 together with the composite layer 211 form a plurality of memory units 245. The memory units 245 and the memory units 207 together constitute a memory cell column. Thereafter, any residual gate material 243 in the area designated for forming the source region and the drain region on each side of the memory cell column is removed.

The method of removing residual gate material 243 includes performing an etching process, for example. After that, a source region 247a and a drain region 247b are formed in the substrate 200 on the two sides adjacent to the memory cell column. The step of forming the source region 247a and the drain region 247b includes implanting p-type ions or n-type ions, according to the actual desired device state, into the substrate in an ion implant process, for example.

In the aforementioned embodiment, the gate 243 includes the metal silicide layer 241 and the doped polysilicon layer 213b. Hence, the resistance of the gate 243 is reduced. In addition, the metal silicide layer 241 is formed in a self-aligned metal silicide process. Therefore, no additional photomask is required. Consequently, the process for forming the non-volatile memory is simplified and the production cost is reduced.

In summary, the gate of the memory unit in the method of fabricating the non-volatile memory according to the present invention includes the doped polysilicon layer 213a and the metallic layer 217a as shown in FIG. 2G. Alternatively, the gate of the memory unit includes the doped polysilicon layer 213b and the metal silicide layer 241 as shown in FIG. 2I. Since only a single photomask is required to define the memory units 207 and there is no need to perform photolithographic and etching processes to fabricate the gate of another memory unit, the processing is simplified and the production cost is reduced.

Moreover, the gate of the memory unit is a composite layer including a doped polysilicon layer together with a metallic layer or a metal silicide layer. Hence, the gate resistance is reduced and gate conductivity is increased so that the electrical properties of the memory units 245 and the memory units 207 are compatible with each other. Ultimately, the device performance and stability is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a non-volatile memory, comprising the steps of:

providing a substrate;

forming a plurality of first memory units on the substrate with every adjoining first memory units are separated from each other by a gap, wherein each first memory unit comprises a first composite layer, a first gate and a cap layer sequentially stacked on the substrate and the first composite layer comprises a first bottom dielectric layer, a first charge-trapping layer and a first top dielectric layer;

forming a plurality of insulating spacers on the sidewalls of the first memory units;

forming a second composite layer over the substrate, wherein the second composite layer comprises a second bottom dielectric layer, a second charge-trapping layer and a second top dielectric layer;

forming a doped polysilicon layer over the substrate, wherein the doped polysilicon layer fills the gaps between various first memory units;

removing a portion of the doped polysilicon layer so that the top surface of the doped polysilicon layer is at least lower than the top surface of the cap layer;

forming a metal silicide layer over the doped polysilicon layer, wherein the metal silicide layer together with the doped polysilicon layer form a plurality of second gates, the second gates together with the second composite layer form a plurality of second memory units, and the second memory units together with the first memory units constitute a memory cell column; and forming a source region and a drain region in the substrate on the two sides of the memory cell column.

2. The method of claim 1, wherein the step of forming the metal silicide layer over the doped polysilicon layer comprises:

forming a metallic layer over the substrate;

performing an annealing process such that a portion of the metallic layer reacts with the doped polysilicon layer to form the metal silicide layer; and removing any residual metallic layer not participated in the reaction.

3. The method of claim 2, wherein the material constituting the metallic layer comprises refractory metal.

4. The method of claim 3, wherein the material constituting the metallic layer comprises cobalt or titanium.

5. The method of claim 3, wherein the step of forming the metallic layer over the substrate comprises performing a sputtering process.

6. The method of claim 3, wherein the step of removing a portion of the doped polysilicon layer comprises performing a etching back process.

7. The method of claim 1, wherein the material constituting the first bottom dielectric layer, the first top dielectric layer, the second bottom dielectric layer and the second top dielectric layer comprises silicon oxide.

8. The method of claim 1, wherein the material constituting the first charge-trapping layer and the second charge-trapping layer comprises silicon nitride or doped polysilicon.

* * * * *